(12) United States Patent
Miles et al.

(10) Patent No.: US 8,278,726 B2
(45) Date of Patent: *Oct. 2, 2012

(54) CONTROLLING ELECTROMECHANICAL BEHAVIOR OF STRUCTURES WITHIN A MICROELECTROMECHANICAL SYSTEMS DEVICE

(75) Inventors: Mark W. Miles, Atlanta, GA (US); John Batey, San Jose, CA (US); Clarence Chui, San Jose, CA (US); Manish Kothari, San Jose, CA (US); Ming-Hau Tung, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/861,778

(22) Filed: Aug. 23, 2010

(65) Prior Publication Data

US 2010/0320555 A1 Dec. 23, 2010

Related U.S. Application Data

(63) Continuation of application No. 11/090,911, filed on Mar. 25, 2005, now Pat. No. 7,781,850, which is a continuation-in-part of application No. 10/251,196, filed on Sep. 20, 2002, now Pat. No. 7,550,794.

(60) Provisional application No. 60/613,466, filed on Sep. 27, 2004.

(51) Int. Cl.
*H01L 29/84* (2006.01)

(52) U.S. Cl. ........ 257/415; 257/414; 257/417; 257/419; 257/E29.324; 310/324; 310/330

(58) Field of Classification Search .......... 257/414–415, 257/428–429, 431, 432, 417, 419, E29.324; 359/290–291; 310/324, 330, 349

See application file for complete search history.

(56) References Cited

U.S. PATENT DOCUMENTS

| 4,190,488 A | 2/1980 | Winters |
| 4,498,953 A | 2/1985 | Cook et al. |
| 4,500,171 A | 2/1985 | Penz et al. |
| 4,519,676 A | 5/1985 | te Velde |
| 4,560,435 A | 12/1985 | Brown et al. |

(Continued)

FOREIGN PATENT DOCUMENTS

CN 1378245 11/2002

(Continued)

OTHER PUBLICATIONS

Office Action dated Dec. 7, 2007 in Chinese App. No. 03821986.7.

(Continued)

*Primary Examiner* — Kenneth Parker
*Assistant Examiner* — Jose R Diaz
(74) *Attorney, Agent, or Firm* — Knobbe Martens Olson & Bear LLP

(57) ABSTRACT

In one embodiment, the invention provides a method for fabricating a microelectromechanical systems device. The method comprises fabricating a first layer comprising a film having a characteristic electromechanical response, and a characteristic optical response, wherein the characteristic optical response is desirable and the characteristic electromechanical response is undesirable; and modifying the characteristic electromechanical response of the first layer by at least reducing charge build up thereon during activation of the microelectromechanical systems device.

31 Claims, 12 Drawing Sheets

U.S. PATENT DOCUMENTS

| | | |
|---|---|---|
| 4,566,935 A | 1/1986 | Hornbeck |
| 4,710,732 A | 12/1987 | Hornbeck |
| 4,880,493 A | 11/1989 | Ashby et al. |
| 4,900,395 A | 2/1990 | Syverson et al. |
| 4,954,789 A | 9/1990 | Sampsell |
| 4,956,619 A | 9/1990 | Hornbeck |
| 5,083,857 A | 1/1992 | Hornbeck |
| 5,099,353 A | 3/1992 | Hornbeck |
| 5,124,834 A | 6/1992 | Cusano et al. |
| 5,190,637 A | 3/1993 | Guckel |
| 5,216,537 A | 6/1993 | Hornbeck |
| 5,231,532 A | 7/1993 | Magel et al. |
| 5,293,272 A | 3/1994 | Jannson et al. |
| 5,324,683 A | 6/1994 | Fitch et al. |
| 5,345,328 A | 9/1994 | Fritz et al. |
| 5,358,806 A | 10/1994 | Haraichi et al. |
| 5,381,040 A | 1/1995 | Sun et al. |
| 5,439,763 A | 8/1995 | Shimase et al. |
| 5,454,906 A | 10/1995 | Baker et al. |
| 5,583,688 A | 12/1996 | Hornbeck |
| 5,646,768 A | 7/1997 | Kaeriyama |
| 5,656,554 A | 8/1997 | Desai et al. |
| 5,683,649 A | 11/1997 | Chatterjee et al. |
| 5,690,839 A | 11/1997 | Min |
| 5,719,068 A | 2/1998 | Suzawa et al. |
| 5,726,480 A | 3/1998 | Pister |
| 5,771,321 A | 6/1998 | Stern |
| 5,784,212 A | 7/1998 | Hornbeck |
| 5,801,084 A | 9/1998 | Beasom et al. |
| 5,822,110 A | 10/1998 | Dabbaj |
| 5,825,528 A | 10/1998 | Goosen |
| 5,835,255 A | 11/1998 | Miles |
| 5,967,163 A | 10/1999 | Pan et al. |
| 5,986,796 A | 11/1999 | Miles |
| 6,008,123 A | 12/1999 | Kook et al. |
| 6,031,653 A | 2/2000 | Wang |
| 6,040,937 A | 3/2000 | Miles |
| 6,046,659 A | 4/2000 | Loo et al. |
| 6,100,477 A | 8/2000 | Randall et al. |
| 6,162,657 A | 12/2000 | Schiele et al. |
| 6,165,890 A | 12/2000 | Kohl et al. |
| 6,195,196 B1 | 2/2001 | Kimura et al. |
| 6,204,080 B1 | 3/2001 | Hwang |
| 6,215,221 B1 | 4/2001 | Cabuz et al. |
| 6,248,654 B1 | 6/2001 | Lee et al. |
| 6,288,472 B1 | 9/2001 | Cabuz et al. |
| 6,297,072 B1 | 10/2001 | Tilmans et al. |
| 6,319,824 B1 | 11/2001 | Lee et al. |
| 6,337,027 B1 | 1/2002 | Humphrey |
| 6,342,452 B1 | 1/2002 | Coronel et al. |
| 6,356,254 B1 | 3/2002 | Kimura |
| 6,359,673 B1 | 3/2002 | Stephenson |
| 6,376,787 B1 | 4/2002 | Martin et al. |
| 6,377,233 B2 | 4/2002 | Colgan et al. |
| 6,392,233 B1 | 5/2002 | Channin et al. |
| 6,407,851 B1 | 6/2002 | Islam et al. |
| 6,446,486 B1 | 9/2002 | deBoer et al. |
| 6,447,126 B1 | 9/2002 | Hornbeck |
| 6,448,622 B1 | 9/2002 | Franke et al. |
| 6,452,124 B1 * | 9/2002 | York et al. .................. 200/181 |
| 6,452,465 B1 | 9/2002 | Brown et al. |
| 6,465,320 B1 | 10/2002 | McNeil et al. |
| 6,466,354 B1 | 10/2002 | Gudeman |
| 6,513,911 B1 | 2/2003 | Ozaki et al. |
| 6,567,312 B1 | 5/2003 | Torii |
| 6,574,033 B1 | 6/2003 | Chui et al. |
| 6,602,791 B2 | 8/2003 | Ouellet et al. |
| 6,608,268 B1 | 8/2003 | Goldsmith |
| 6,618,187 B2 | 9/2003 | Pilossof |
| 6,620,712 B2 | 9/2003 | Huang et al. |
| 6,635,919 B1 | 10/2003 | Melendez et al. |
| 6,657,832 B2 | 12/2003 | Williams et al. |
| 6,666,979 B2 | 12/2003 | Chinn et al. |
| 6,674,090 B1 | 1/2004 | Chua et al. |
| 6,674,562 B1 | 1/2004 | Miles |
| 6,689,211 B1 | 2/2004 | Wu et al. |
| 6,713,235 B1 | 3/2004 | Ide et al. |
| 6,741,377 B2 | 5/2004 | Miles |
| 6,756,317 B2 | 6/2004 | Sniegowski et al. |
| 6,778,306 B2 | 8/2004 | Sniegowski et al. |
| 6,782,166 B1 | 8/2004 | Grote et al. |
| 6,791,441 B2 | 9/2004 | Pillans et al. |
| 6,794,119 B2 | 9/2004 | Miles |
| 6,806,110 B2 | 10/2004 | Lester et al. |
| 6,812,482 B2 | 11/2004 | Fleming et al. |
| 6,867,896 B2 | 3/2005 | Miles |
| 6,905,613 B2 | 6/2005 | Gutierrez et al. |
| 6,940,631 B2 | 9/2005 | Ishikawa |
| 6,951,824 B2 | 10/2005 | Fischer et al. |
| 6,960,305 B2 | 11/2005 | Doan et al. |
| 7,008,812 B1 | 3/2006 | Carley |
| 7,041,224 B2 | 5/2006 | Patel et al. |
| 7,049,164 B2 | 5/2006 | Bruner |
| 7,110,158 B2 | 9/2006 | Miles |
| 7,123,216 B1 | 10/2006 | Miles |
| 7,183,637 B2 | 2/2007 | Bruner |
| 7,550,794 B2 | 6/2009 | Miles et al. |
| 7,642,110 B2 | 1/2010 | Miles |
| 7,781,850 B2 * | 8/2010 | Miles et al. .................. 257/414 |
| 2001/0003487 A1 | 6/2001 | Miles |
| 2002/0003400 A1 | 1/2002 | Lee |
| 2002/0014579 A1 | 2/2002 | Dunfield |
| 2002/0021485 A1 | 2/2002 | Pilossof |
| 2002/0024711 A1 | 2/2002 | Miles |
| 2002/0027636 A1 | 3/2002 | Yamada |
| 2002/0054424 A1 | 5/2002 | Miles |
| 2002/0055253 A1 | 5/2002 | Rudhard |
| 2002/0070931 A1 | 6/2002 | Ishikawa |
| 2002/0086455 A1 | 7/2002 | Franosch et al. |
| 2002/0110948 A1 | 8/2002 | Huang et al. |
| 2002/0117728 A1 | 8/2002 | Brosnihan et al. |
| 2002/0125822 A1 | 9/2002 | Graff et al. |
| 2002/0135857 A1 | 9/2002 | Fitzpatrick et al. |
| 2002/0155717 A1 | 10/2002 | Sniegowski et al. |
| 2002/0195681 A1 | 12/2002 | Melendez et al. |
| 2003/0003682 A1 | 1/2003 | Moll et al. |
| 2003/0003761 A1 | 1/2003 | Yang et al. |
| 2003/0006468 A1 | 1/2003 | Ma et al. |
| 2003/0029831 A1 | 2/2003 | Kawase |
| 2003/0047533 A1 | 3/2003 | Reid et al. |
| 2003/0071015 A1 | 4/2003 | Chinn et al. |
| 2003/0072070 A1 | 4/2003 | Miles |
| 2003/0111439 A1 | 6/2003 | Fetter et al. |
| 2003/0138986 A1 | 7/2003 | Bruner |
| 2003/0141561 A1 | 7/2003 | Fischer et al. |
| 2003/0202264 A1 | 10/2003 | Weber et al. |
| 2003/0202265 A1 | 10/2003 | Reboa et al. |
| 2004/0028849 A1 | 2/2004 | Stark et al. |
| 2004/0035821 A1 | 2/2004 | Doan et al. |
| 2004/0038513 A1 | 2/2004 | Kohl et al. |
| 2004/0051929 A1 | 3/2004 | Sampsell et al. |
| 2004/0053434 A1 | 3/2004 | Bruner |
| 2004/0058532 A1 | 3/2004 | Miles et al. |
| 2004/0080832 A1 | 4/2004 | Singh |
| 2004/0124073 A1 | 7/2004 | Pilans et al. |
| 2004/0136076 A1 | 7/2004 | Tayebati |
| 2004/0217264 A1 | 11/2004 | Wood et al. |
| 2004/0244191 A1 | 12/2004 | Orr et al. |
| 2005/0045276 A1 | 3/2005 | Patel et al. |
| 2005/0226281 A1 | 10/2005 | Faraone et al. |
| 2008/0130089 A1 | 6/2008 | Miles |
| 2009/0323168 A1 | 12/2009 | Miles et al. |

FOREIGN PATENT DOCUMENTS

| | | |
|---|---|---|
| DE | 199 38 072 | 3/2000 |
| EP | 0 035 299 | 9/1983 |
| EP | 0 695 959 | 2/1996 |
| EP | 0 788 005 | 8/1997 |
| EP | 1 209 738 | 5/2002 |
| JP | 49-004993 | 1/1974 |
| JP | 01-102415 | 4/1989 |
| JP | 5-49238 | 2/1993 |
| JP | 05275401 | 10/1993 |
| JP | 06-350105 | 12/1994 |
| JP | 07-098326 | 4/1995 |
| JP | 07-060844 | 7/1995 |
| JP | 09-33942 | 7/1997 |

| | | |
|---|---|---|
| JP | 10-020328 | 1/1998 |
| JP | 10-148644 | 6/1998 |
| JP | 10-209176 | 8/1998 |
| JP | 11-258777 | 9/1999 |
| JP | 2000-28938 | 1/2000 |
| JP | 2001-085519 | 3/2001 |
| JP | 2002-287047 | 3/2001 |
| JP | 2001-272613 | 10/2001 |
| JP | 2002-207182 | 7/2002 |
| JP | 2002-243937 | 8/2002 |
| JP | 2002-328313 | 11/2002 |
| JP | 2003-001598 | 1/2003 |
| JP | 2003-136499 | 5/2003 |
| JP | 2003-315732 | 11/2003 |
| JP | 2003-340795 | 12/2003 |
| JP | 2004-106074 | 4/2004 |
| TW | 546833 | 8/2003 |
| WO | WO 91/05284 | 4/1991 |
| WO | WO 92/10925 | 6/1992 |
| WO | WO 95/30924 | 11/1995 |
| WO | WO 98/29748 | 7/1998 |
| WO | WO 99/52006 | 10/1999 |
| WO | WO 01/14248 | 3/2001 |
| WO | WO 01/63657 | 8/2001 |
| WO | WO 02/24570 | 3/2002 |
| WO | WO 02/075803 | 9/2002 |
| WO | WO 03/107094 | 12/2003 |
| WO | WO 2004/003981 | 1/2004 |
| WO | WO 2005/085932 | 9/2005 |

OTHER PUBLICATIONS

Supplementary European Search Report dated Oct. 19, 2010 in App. No. 03759463.7.
Office Action dated Mar. 23, 2011 in U.S. Appl. No. 12/498,250.
Notice of the Final Rejection dated Feb. 25, 2011 in Korean App. No. 2005-7004794.
Aratani et al., Process and Design Considerations for Surface Micromachined Beams for a Tuneable Interferometer Array in Silicon, Proc. IEEE Microelectromechanical Workshop, Fort Lauderdale, FL, pp. 230-235 (Feb. 1993).
Aratani K. et al. Surface Micromachined Tuneable Interferometer Array, Sensors and Actuators A, Elsevier Sequoia S.A., Lausanne, CH, A43(1/3):17-23, May 1, 1994.
Ibbotson et al., Comparison of XeF2 and F-atom reactions with Si and SiO2, Applied Physics Letters, 44(12):1129-1131 (Jun. 1984).
Raley et al., A Fabry-Perot Microinterferometer for Visible Wavelengths, IEEE Solid-State Sensor and Actuator Workshop, Hilton Head, SC, pp. 170-173 (1992).
Sridharan et al. Post-packaging Release a New Concept for Surface-Micromachined Devices Technical Digest, IEEE Solid-State Sensor & Actuator Workshop, New York, NY US Nov. 8, 1998 pp. 225-228.
Williams et al., Dec. 2003, Etch rates for micromachining processing—part II, Journal of Microelectromechanical Systems, 12(6):761-778.
Winters, et al. The etching of silicon with XeF2 vapor. Applied Physics Letters, 34(1):70-73, (Jan. 1979).
Office Action dated Aug. 20, 2004 in U.S. Appl. No. 10/251,196.
Office Action dated Dec. 28, 2005, in U.S. Appl. No. 10/251,196.
Office Action dated Jun. 6, 2006 in U.S. Appl. No. 10/251,196.
Office Action dated Dec. 1, 2006 in U.S. Appl. No. 10/251,196.
Office Action dated May 14, 2007 in U.S. Appl. No. 10/251,196.
Office Action dated Dec. 3, 2007 in U.S. Appl. No. 10/251,196.
Office Action dated Jul. 18, 2008 in U.S. Appl. No. 10/251,196.
ISR and WO for PCT/US05/030902 Dated Jan. 26, 2006.
IPRP for PCT/US05/030902 dated Apr. 5, 2007.
ISR for PCT/US03/30016 dated Apr. 27, 2004.
Examiner's Report dated Feb. 26, 2008 in Australian App. No. 2003275194.
Office Action dated May 9, 2008 in Chinese App. No. 03821986.7.
Office Action dated Aug. 15, 2008 in Chinese App. No. 03821986.7.
Decision of Final Rejection dated Nov. 28, 2008 in Chinese App. No. 03821986.7.
Official Action received Oct. 5, 2007 in Russian App. No. 2005111765.
Official Action received May 26, 2008 in Russian App. No. 2005111765.
Official Action dated May 13, 2009 in Russian App. No. 2005111765.
Official Action dated Apr. 25, 2009 in Mexican App. No. PA/a/2005/003078.
Notice of Reasons for Rejection dated Jul. 28, 2009 in Japanese App. No. 2004-538461.
Office Action dated Nov. 14, 2008 in Chinese App. No. 200580032155.2.
Office Action dated Jan. 8, 2010 in Chinese App: No. 200580032155.2.
Boucinha et al., 2000, Amorphous silicon air-gap resonators on large-area substrates, Applied Physics Letters, 77(6):907-909.
Rusu et al., 2001, Planarization of deep trenches, Proc. SPIE, 4557:49-57.
Yao et al., BrF3 dry release technology for large freestanding parylene microstructures and electrostatic actuators, Sensors and Actuators A, 97-98:771-775, Apr. 2002.
Office Action dated Aug. 5, 2010 in U.S. Appl. No. 12/498,250.
Notice of Reasons for Rejection dated Aug. 10, 2010 in Japanese App. No. 2004-538461.
Notice of Grounds for Rejection dated Jul. 27, 2010 in Korean App. No. 2005-7004794.
Notice of Grounds for Rejection dated May 23, 2011 in Korean App. No. 2011-7009971.
Office Action dated May 16, 2001 in Canadian App. No. 2,581,670.

* cited by examiner

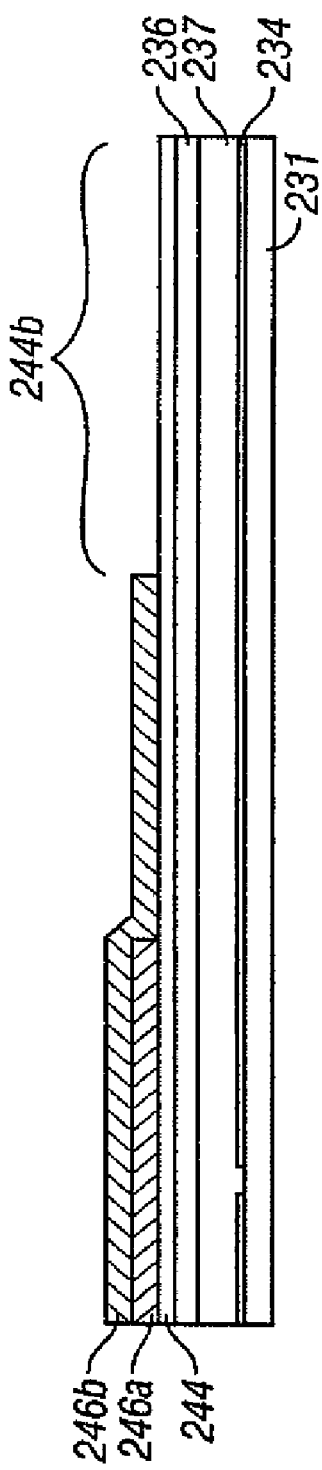
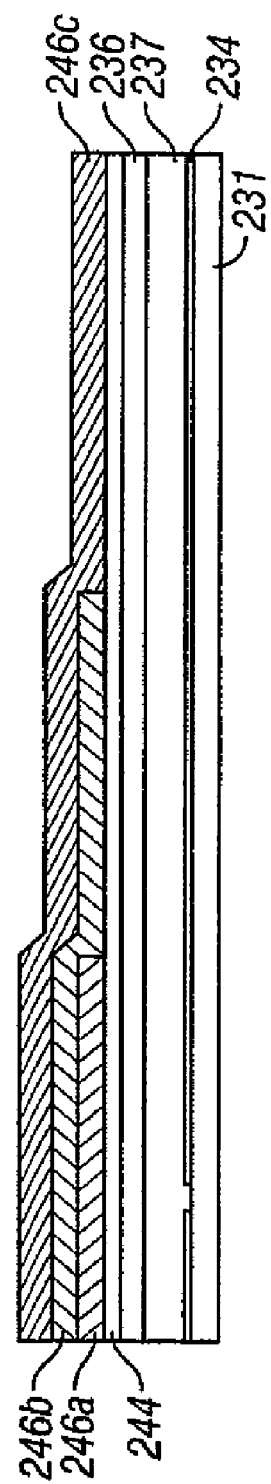
FIG. 10C
FIG. 10D

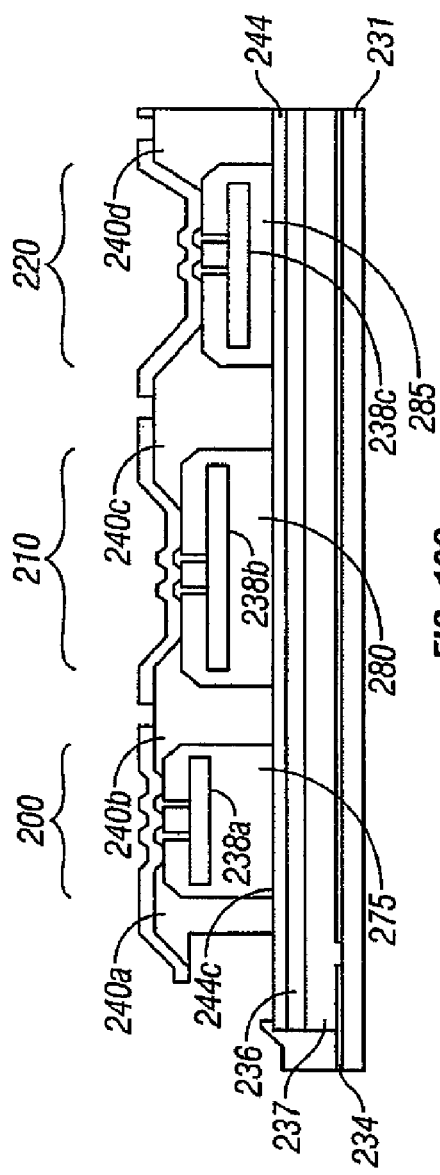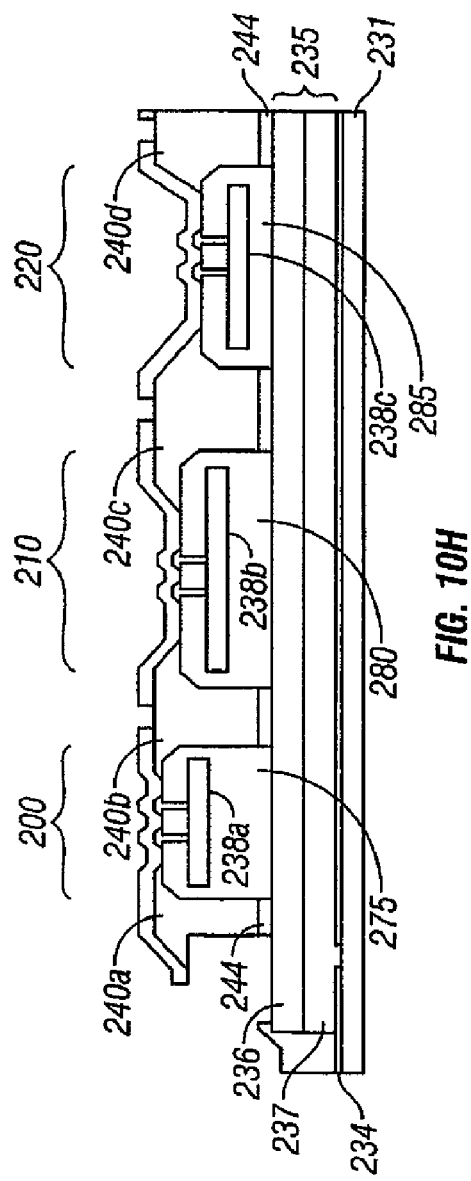

12,278,726 B2

CONTROLLING ELECTROMECHANICAL BEHAVIOR OF STRUCTURES WITHIN A MICROELECTROMECHANICAL SYSTEMS DEVICE

RELATED APPLICATIONS

This application is a continuation of U.S. patent application Ser. No. 11/090,911, filed on Mar. 25, 2005, issued as U.S. Pat. No. 7,781,850, which is a continuation-in-part of U.S. patent application Ser. No. 10/251,196, filed on Sep. 20, 2002, now issued as U.S. Pat. No. 7,550,794, and which claims priority under 35 U.S.C. §119(e) to U.S. Provisional Application 60/613,466, filed on Sep. 27, 2004, each of which is hereby incorporated by reference.

BACKGROUND OF THE INVENTION

1. Field of the Invention

This invention relates to microelectromechanical systems devices. In particular it relates to thin film structures in microelectromechanical systems devices and to electromechanical and optical responses of such thin film structures.

2. Description of the Related Art

Today a wide variety of microelectromechanical systems (MEMS) devices may be fabricated using microfabrication techniques. Examples of these MEMS devices include motors, pumps, valves, switches, sensors, pixels, etc.

Often these MEMS devices harness principles and phenomena from different domains such as the optical, electrical and mechanical domains. Such principles and phenomena, while seemingly difficult to harness in the macroscopic world, can become extremely useful in the microscopic world of MEMS devices, where such phenomena become magnified. For example, electrostatic forces which are generally considered to be too weak in the macroscopic world to be harnessed, are strong enough in the microscopic world of MEMS devices to activate these devices, often at high speeds and with low power consumption.

Materials used in MEMS devices are generally selected based on their inherent properties in the optical, electrical, and mechanical domains and the characteristic response to input, such as for example, a driving or actuation voltage.

One problem affecting the fabrication of MEMS devices is that in some cases, a material having a highly desirable response to input, for example an optical response to incident light, may also have an undesirable response to input, for example, an electromechanical response to an actuation or driving voltage. To overcome, or at least reduce, the undesirable response, new materials have to be found or developed often at great expense.

Another problem with the fabrication of MEMS devices is that sometimes, a material selected for its characteristic response may become damaged due to exposure to chemical agents used during a particular microfabrication process. This causes the material to demonstrate less of the characteristic response to the input.

SUMMARY OF THE INVENTION

In one embodiment, the invention provides a MEMS device having a substrate, the device including an electrode layer formed over the substrate, a dielectric layer formed over the electrode layer, a first etch barrier layer formed over the dielectric layer, a cavity located above the first etch barrier, and a moving layer located above the cavity. In further embodiments, the device includes a second etch barrier layer formed over the first etch barrier layer.

In another embodiment, a method of manufacturing a MEMS device is provided, including depositing an electrode layer on a substrate, depositing a dielectric layer over the electrode layer, and depositing an etch stop layer over the dielectric layer. In a further embodiment, the method includes depositing a sacrificial layer over the etch stop layer, depositing a reflective layer of the sacrificial layer, and etching the first sacrificial layer to completely remove the first sacrificial layer, creating an interferometric cavity. In yet further embodiments, a protective layer is formed between the etch stop layer and the first sacrificial layer.

In another embodiment, a method of manufacturing a MEMS device is provided, including depositing an electrode layer on a substrate, depositing a charge-trapping layer over the electrode layer, and depositing a first etch barrier layer over the dielectric layer. In further embodiments, a second etch barrier layer is deposited over the first etch barrier layer.

BRIEF DESCRIPTION OF THE DRAWINGS

FIGS. 10A-10H illustrate an exemplary process for manufacturing a MEMS device;

DETAILED DESCRIPTION OF THE PREFERRED EMBODIMENT

A particular structure or layer within a microelectromechanical systems (MEMS) device may be desirable for its optical response to input in the form of incident light, but may at the same time have an undesirable electromechanical response to input in the form of an actuation or driving voltage. Techniques are disclosed herein to manipulate or control the electromechanical response of the structure or layer, thus at least reducing the undesirable electromechanical response.

Figure 1:
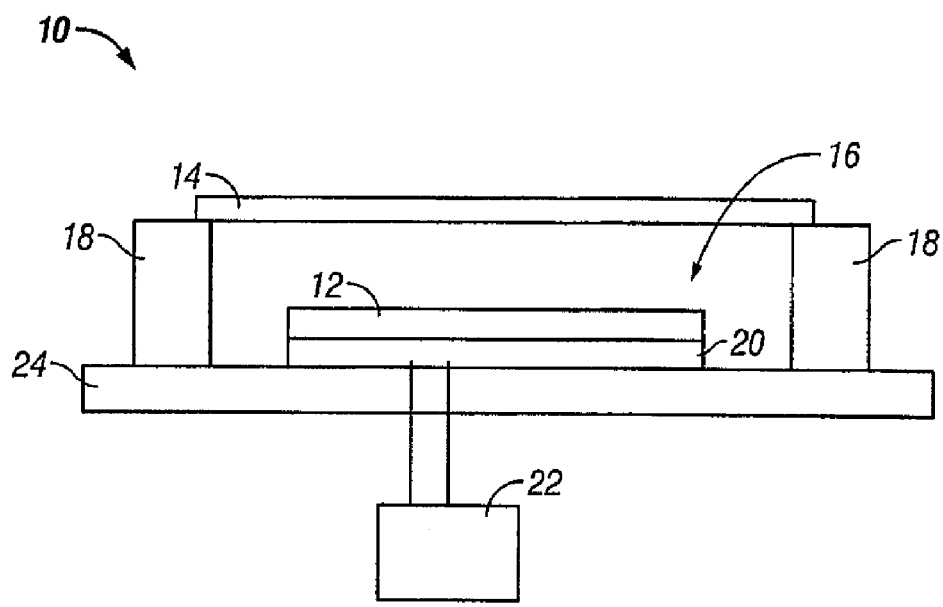
FIGS. 1 and 2 show schematic cross-sections of a MEMS device in an unactuated, and an actuated state respectively.

As an illustrative, but a non-limiting example of a MEMS device, consider the interference modulator (IMOD) device 10 shown in FIG. 1 of the drawings. Referring to FIG. 1, it will be seen that IMOD device 10 has been greatly simplified for illustrative purposes so as not to obscure aspects of the present invention.

Figure 2:
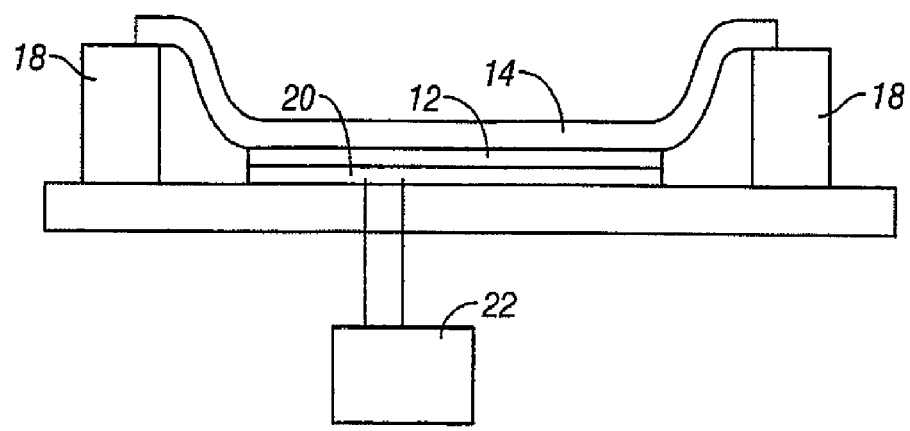

The IMOD device 10 includes a transparent layer 12 and a reflective layer 14 which is spaced from the transparent layer 12 by an air gap 16. The reflective layer 14 is supported on posts 18 and is electrostatically displaceable towards the transparent layer 12 thereby to close the air gap 16. An electrode 20 which is connected to a driving mechanism 22 is used to cause the electrostatic displacement of reflective layer 14. FIG. 1 shows the reflective layer 14 in an undriven or undisplaced condition, whereas FIG. 2 shows the reflective layer 14 in a driven or displaced condition. The reflective layer 14 is generally selected to produce a desired optical response to incident light when it is brought into contact with the transparent layer 12. In one IMOD design, the transparent layer 12 may comprise $SiO_2$. The electrode 20 and the transparent layer 12 are formed on a substrate 24. The substrate 24, the electrode 20, and the transparent layer 12 thereon will be referred to as a "thin film stack."

Typically, a plurality of IMOD devices 10 are fabricated in a large array so as to form pixels within a reflective display. Within such a reflective display, each IMOD device 10 essentially defines a pixel which has a characteristic optical response when in the undriven state, and a characteristic optical response when in the driven state. The transparent layer 12 and the size of the air gap 16 may be selected so that an IMOD within the reflective display may reflect red, blue, or green light when in the undriven state and may absorb light when in the driven state, as described in more detail with respect to FIGS. 10A-10H.

It will be appreciated that during operation of the reflective display, the IMOD devices 10 are rapidly energized, and de-energized in order to convey information. When energized, the reflective layer 14 of an IMOD 10 device is electrostatically driven towards the transparent layer 12, and when the IMOD 10 is de-energized, the reflective layer 14 is allowed to return to its undriven state. In order to keep the reflective layer 14 in its driven condition, a bias voltage is applied to each IMOD device 10.

If an actuation voltage, $V_{actuation}$, defined as a voltage required to electrostatically drive the reflective layer 14 of an IMOD device to its driven condition, as shown in FIG. 2 of the drawings, is equal to a release voltage, $V_{release}$, defined as the voltage at which the reflective layer 14 returns to its undisplaced condition, as is shown in FIG. 1 of the drawings, then it becomes extremely difficult to select an appropriate bias voltage, $V_{bias}$, that can be applied to all of the IMOD's 10 within the reflective display to keep the reflective layers 14 of each respective IMOD device 10 within the reflective display in its driven condition. The reason for this is that each IMOD 10 within the reflective display may have slight variations, for example, variations in a thickness of the layers 12, 14, etc., which, in practice, result in a different release voltage, $V_{release}$, for each IMOD 10. Further, due to line resistance, there will be variations in the actual voltage applied to each IMOD 10, based on its position within the display. This makes it very difficult, if not impossible, to select a value for $V_{bias}$ that will keep the reflective layer 14 of each respective IMOD 10 within the reflective display in its driven condition. This is explained with reference to FIG. 3 of the drawings, which shows the observed hysteresis behavior of the reflective layer 14 of an IMOD 10, in which the transparent layer 12 comprised $SiO_2$.

Figure 3:
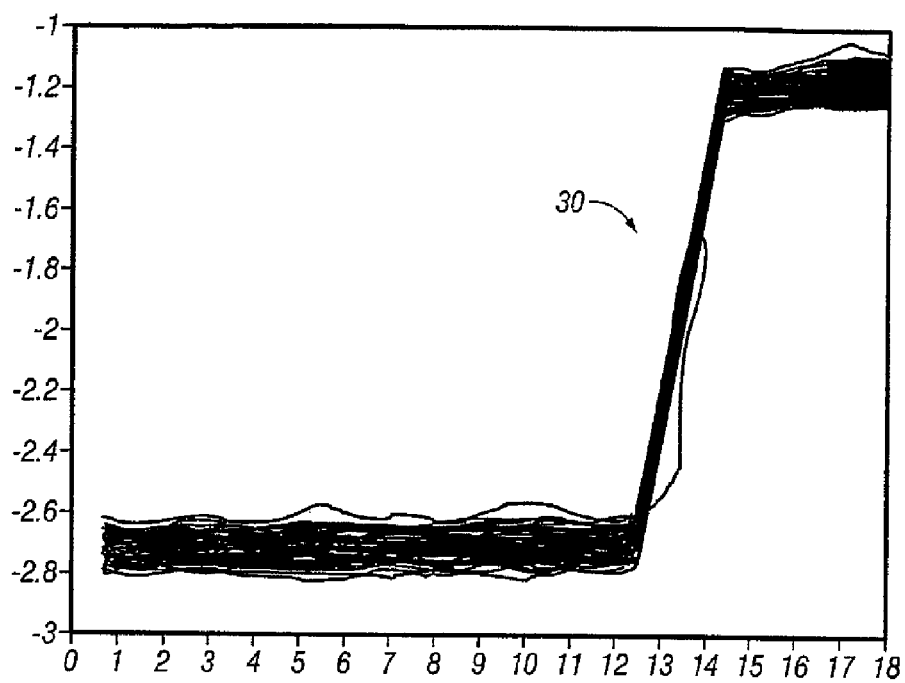
FIG. 3 shows a chart of the actuation and release voltages for the MEMS device of FIGS. 1 and 2.

Referring to FIG. 3, a curve, 30 is shown, which plots applied voltage (in volts) on the X-axis, against optical response measured in the volts on the Y-axis for an IMOD 10 comprising a transparent layer of $SiO_2$. As can be seen, actuation of the reflective layer 14 occurs at about 12.5 volts, i.e., $V_{actuation}$ equals 12.5 volts, and the reflective layer 14 returns to its undriven condition when the applied voltage falls to below 12.5 volts, i.e., $V_{release}$, equals 12.5 volts. Thus, the reflective layer 14 in an IMOD device 10 in which the transparent layer comprises only $SiO_2$ can sometimes demonstrate no hysteresis. Therefore, if the reflective display is fabricated using IMOD devices 10, each comprising a transparent layer 12 and the hysteresis behavior of FIG. 3, it would be impossible to select a value for $V_{bias}$. For example, if $V_{bias}$ is selected to be 12.5 volts, because of variations within the IMOD devices 10 in the reflective display, for at least some of the IMOD devices 10, a $V_{bias}$ of 12.5 volts would fail to keep the reflective layer 14 of those IMOD devices 10 in the driven condition.

In order to select a $V_{bias}$ that is sufficient to keep the reflective layer 14 of a respective IMOD device 10 within a reflective display in its driven condition, it is necessary for each reflective layer 14 of a respective IMOD device 10 within the reflective display to demonstrate some degree of hysteresis, defined as a non-zero difference between the $V_{actuation}$ and $V_{release}$.

It will be appreciated, in view of the disclosure herein, that the electromechanical response of the reflective layer 14 of each IMOD device 10 is determined by the electromechanical properties of the reflective layer 14 as well as the electrical properties of the transparent layer 12. In one particular IMOD device design, the transparent layer 12 comprises $SiO_2$ which gives a desired optical response when the reflective layer 14 is brought into contact therewith. However, the transparent layer 12 comprising $SiO_2$ has a certain electrical characteristic or property (the $SiO_2$ traps negative charge) that affects the hysteresis behavior of the reflective layer 14. Thus, the transparent layer 12 has a desired optical response but an undesirable electromechanical response to a driving or actuation voltage which affects the hysteresis behavior of the reflective layer 14.

In accordance with embodiments of the present invention, the electromechanical behavior of the transparent layer 12 is altered by adding a further layer or layers, replacing $SiO_2$, in the thin film stack. This further layer at least minimizes or compensates for the effect of transparent layer 12 on the hysteresis behavior of the reflective layer 14.

Figure 4:
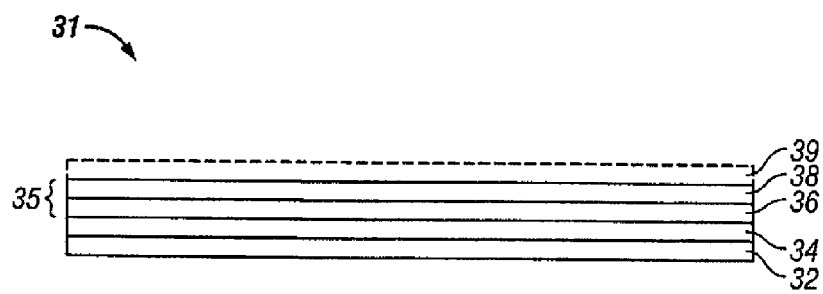
FIG. 4 shows one a thin film stack for a MEMS device, in accordance with one embodiment of the invention.

FIG. 4 illustrates an exemplary thin film stack which can be used to modify the electromechanical response of the device, namely by shifting or otherwise modifying the hysteresis curve. Specifically, FIG. 4 illustrates the formation of a composite layer 35 on a substrate 32 and an electrode 34 by deposition, preferably by CVD. The composite layer 35 comprises a lower layer 36, which may be molybdenum, a silicon-containing material (e.g. silicon, silicon nitride, silicon oxide, etc.), tungsten, or titanium, preferably silicon oxide, which is a dielectric material. In certain embodiments, portions of the lower layer 36 may be removed in a later etching step. The upper, or "stop" layer 38 is preferably a material that is more resistant to a later etching step than the lower layer 36, and may also be a metal (e.g. titanium, aluminum, silver, chromium) or a dielectric material, preferably a metal oxide, e.g. an aluminum oxide. Aluminum oxide may be deposited directly or by deposition of an aluminum layer followed by oxidation. The upper and lower layers 38, 36 may be composed of the same material, but are preferably different materials. In any particular composite layer 35, at least one of the portions 36, 38 is an electrical insulator to avoid shorting the lower electrode 20 to the moving electrode 14 (see FIGS. 1 and 2). The stop layer 38 may be thinner or thicker than the lower layer 36. For example, in an embodiment the stop layer 38 may have a thickness in the range of about 50 angstroms to about 500 angstroms, and the lower layer 36 may have a thickness in the range of about 500 angstroms to about 3000 angstroms. The stop layer 38 serves as the etch stop, preventing removal or other damage to the lower layer 36 located underneath the etch stop 38. The stop layer 38 is more resistant to removal (e.g. etching) than the lower layer 36. In a particular embodiment, discussed in greater detail with respect to FIG. 5, the stop layer 38 is aluminum oxide and the dielectric layer 38 is silicon oxide.

In further embodiments as discussed in greater detail below, a stop layer 38 which is suitable for protecting the lower layer 36 from a given etch process may itself require protection, either from a prior or subsequent etch process or from environmental conditions. In such a case, the deposition of a secondary protective layer 39, shown in phantom in FIG. 4, may advantageously be used to protect the stop layer 38. In certain embodiments, layers 36 and 38 may be deposited, and an etch process may be used during which the stop layer 38 protects dielectric layer 36. The protective layer 39 can then be deposited above the stop layer 38, and may protect it from a subsequent etching process or from environmental conditions. In alternate embodiments, the protective layer 39 can be deposited on the stop layer 38 prior to etching, and protect it from a first etching process which would otherwise have an undesirable effect on the stop layer 38. The protective layer 39 could then be removed by a subsequent etch process, during which the stop layer 38 protects dielectric layer 36. In an exemplary stack, the protective layer 39 comprises $SiO_2$, the stop layer 38 comprises $Al_2O_3$, and the lower layer 36 comprises $SiO_2$. The terms "etch stop," "protective," and "etch barrier" are alternately used herein to describe layers that shield underlying materials from harm during at least one process step, such as an etch step.

Figure 5:
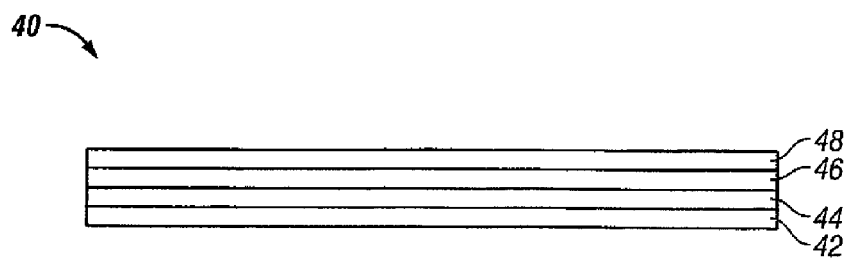
FIG. 5 shows a thin film stack for a MEMS device, in accordance with another embodiment of the invention.

As previously discussed, in one embodiment of the invention, the further layer comprises $Al_2O_3$ which is deposited, in accordance with known deposition techniques, over the transparent layer 12. This results in a thin film stack 40 as shown in FIG. 5 of the drawings, comprising a substrate 42, an electrode 44, an $SiO_2$ reflective layer 46 and an $Al_2O_3$ layer 48.

Figure 6:
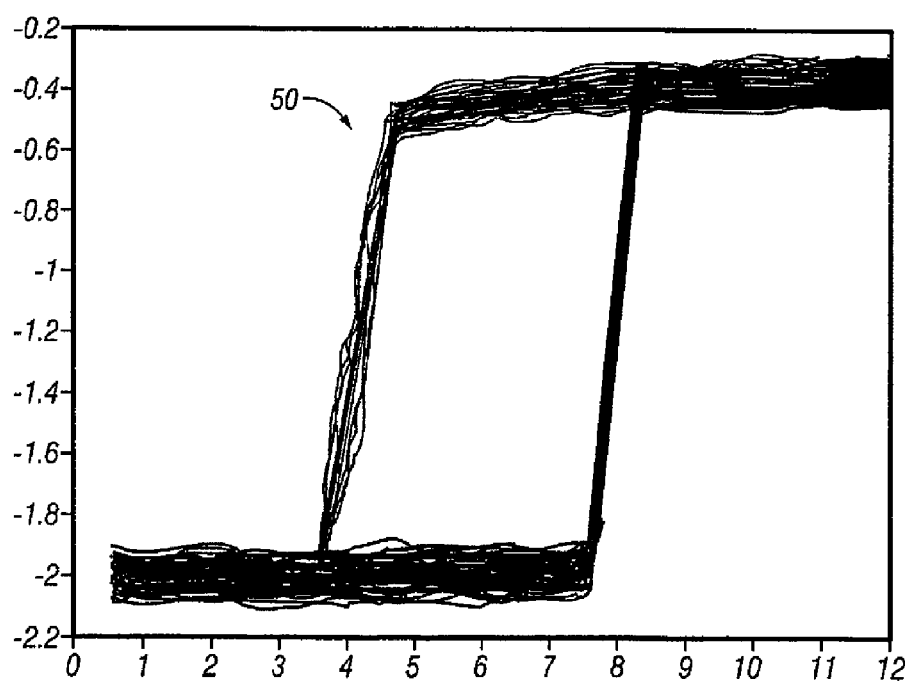
FIG. 6 shows a hysteresis curve for a MEMS device including the thin film stack shown in FIG. 5 of the drawings.

FIG. 6 of the drawings shows a hysteresis curve 50 for an IMOD device 10 comprising the thin film stack 40. As with the hysteresis curve 30 (FIG. 3), the X-axis plots applied voltage in Volts, whereas the Y-axis plots optical response in Volts. The hysteresis curve 50 shows a hysteresis window of 2.8 volts defined as the difference between $V_{actuation}$ (7.8 volts) and $V_{release}$ (5.0 volts). When the individual IMOD's 10 within a reflective display each have a respective reflective layer 14 which demonstrates hysteresis in accordance with the hysteresis curve 50, it will be seen that it is possible to choose a value for the $V_{bias}$ between 5 volts and 7.8 volts which will effectively perform the function of keeping the reflective layer 14 of each respective IMOD device 10 within the reflective display in its driven condition. In a further embodiment of the invention, the thin film stack may be further modified to include an $Al_2O_3$ layer above, as well as below, the transparent layer 12. This embodiment is shown in FIG. 7 of the drawings, where it will be seen that the thin film stack 60 includes a substrate 62, an electrode 64, a first $Al_2O_3$ layer 66, an $SiO_2$ transparent layer 68 and a second $Al_2O_3$ layer 70.

Figure 7:
FIG. 7 shows another embodiment of a thin film stack for a MEMS device.
Figure 8:
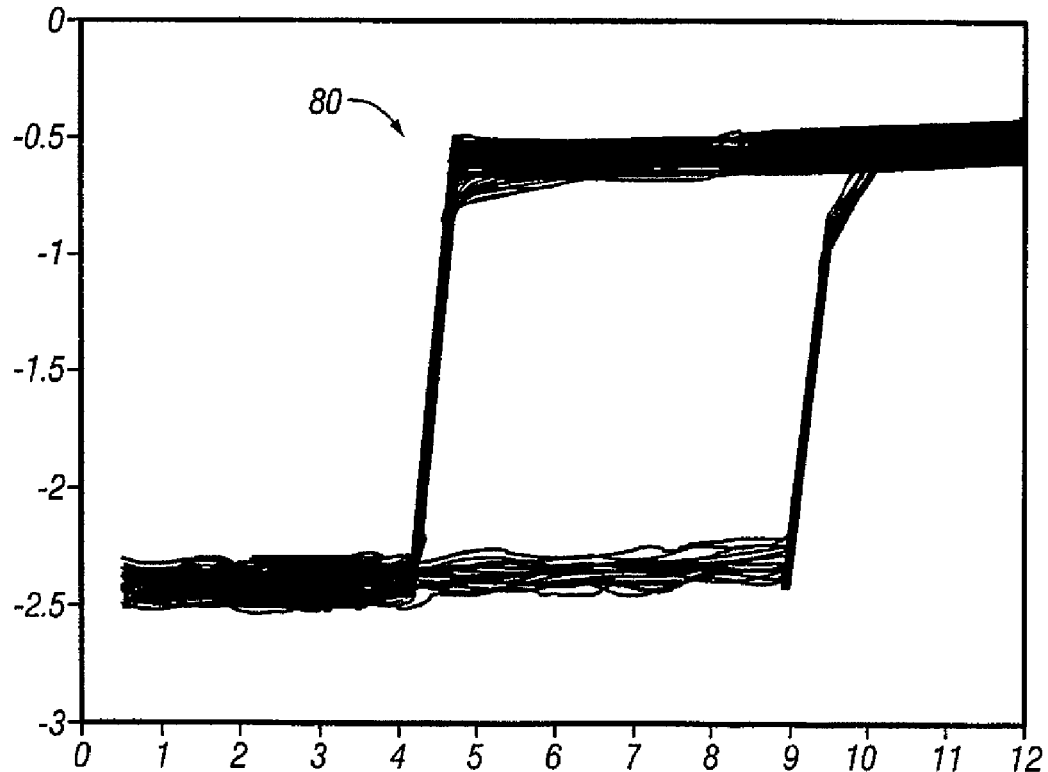
FIG. 8 shows a hysteresis curve for a MEMS device including the thin film stack of FIG. 7 of the drawings.

FIG. 8 of the drawings shows a hysteresis curve 80 for a reflective layer 14 of an IMOD device 10 having the thin film stack 60 shown in FIG. 7 of the drawings. As will be seen, the hysteresis window is now wider, i.e., 4.5 volts, being the difference between $V_{actuation}$ (9 volts) and $V_{release}$ (4.5 volts).

However, other materials that have a high charge trapping density may be used, some of which were discussed above with respect to FIG. 5. These materials include $AlO_x$, which is the off-stoichiometric version of $Al_2O_3$, silicon nitride ($Si_3N_4$), its off-stoichiometric version ($SiN_x$), and tantalum pentoxide ($Ta_2O_5$) and its off-stoichiometric version ($TaO_x$). All of these materials have several orders of magnitude higher charge trapping densities than $SiO_2$ and tend to trap charge of either polarity. Because these materials have a high charge trapping density, it is relatively easy to get charge into and out of these materials, as compared to $SiO_2$, which has a low charge trapping density and has an affinity for trapping negative charge only.

Other examples of materials that have a high charge trapping density include the rare earth metal oxides (e.g., hafnium oxide), and polymeric materials. Further, semiconductor materials doped to trap either negative or positive charge may be used to form the further layer above, and optionally below the $SiO_2$ transparent layer 12.

Thus far, a technique for manipulating the electromechanical behavior of a MEMS device has been described, wherein charge buildup within the MEMS device is controlled by the use of a charge trapping layer which has a high charge trapping density. However, it is to be understood that the invention covers the use of any charge trapping layer to alter or control the electromechanical behavior of a MEMS device regardless of the charge trapping density thereof. Naturally, the choice of a charge trapping layer whether it be of a high, low, or medium charge trapping density will be dictated by what electromechanical behavior for a MEMS device is being sought.

In some embodiments the incorporation of metals, in the form of thin layers or aggregates, provide yet another mechanism for manipulating the charge trapping density of a host film in a MEMS device. Structuring the host film by producing voids or creating a variation or periodicity in its material characteristics may also be used to alter the charge trapping characteristics.

According to another embodiment of the invention, as discussed with respect to FIGS. 4 and 5 above, an IMOD device 10 includes a chemical barrier layer deposited over the transparent layer 12 in order to protect the transparent layer 12 from damage or degradation due to exposure to chemical etchants in the microfabrication process. For example, in one embodiment, the transparent layer 12 which comprises $SiO_2$, is protected by an overlying layer comprising $Al_2O_3$, which acts as a chemical barrier to etchants, for example, $XeF_2$. In such embodiments, it has been found that when the transparent $SiO_2$ layer 12 is protected from the etchants, nonuniformities in the $SiO_2$ are eliminated along with attendant non-uniformities in electromechanical behavior, thus causing the reflective layer 14 within each IMOD device 10 to display hysteresis.

Figure 9A:
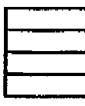
FIGS. 9A-9D show embodiments of a thin film stack for a MEMS device.
Figure 9A:
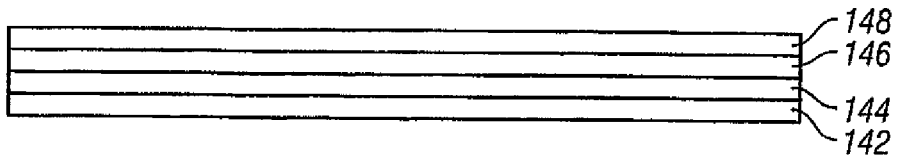

As discussed, silicon nitride (stoichiometric or non-stoichiometric) may be used as the charge trapping layer. FIG. 9A depicts a thin film stack 140a in which a dielectric layer 146 comprising silicon nitride is formed above an electrode 144 and a substrate 142. Above the layer 146 of silicon nitride, a stop layer 148 of aluminum oxide is formed to protect the silicon nitride during an etching process. Because silicon nitride has a high charge trapping density and is capable of trapping both positive and negative charge, the use of silicon nitride layer 146 will have a different effect on the electromechanical properties of thin film stack 140, namely on the width of the hysteresis curve, than the use of a silicon oxide layer.

Figure 9B:
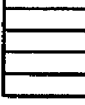
Figure 9B:

In alternate embodiments, the thin film stack 140a of FIG. 9A can be modified to include a protective layer above the etch stop layer 148. FIG. 9B depicts a thin film stack 140b which includes a protective or second etch barrier layer 150a, which in this embodiment comprises an additional layer of silicon nitride. The protective layer 150a is preferably deposited immediately after the deposition of the first etch stop layer 148, as discussed above. In another embodiment, shown in FIG. 9C, a thin film stack 140c includes a protective or second etch barrier layer 150b, which comprises silicon oxide.

The protective layers 150a or 150b are preferably removed by the same etching process which would be used to remove the sacrificial material to form the cavity. Alternatively, the sacrificial material may be removed by a first etch, and the protective layers 150a or 150b may be removed by a second etch. Protective layers such as layers 150a or 150b may comprise silicon oxide or silicon nitride, as previously discussed, but may also comprise, in alternate embodiments, molybdenum, titanium, amorphous silicon, or any other appropriate material. In certain manufacturing processes, the protective layer 150a or 150b may serve to protect aluminum oxide during patterning of the bulk sacrificial layer, as will be better understood from the discussion below of FIGS. 10A-10H. Because the protective layer 150a,b is preferably removed at the same time as the sacrificial material, the protective layer can also be considered a lower or thin sacrificial layer under an upper or bulk sacrificial material of a different composition.

The first or patterning etch may be selected such that the bulk sacrificial material (e.g., Mo) is etched at a significantly greater rate than the protective layer 150a,b, (e.g., silicon oxide, silicon nitride, amorphous silicon or titanium) and the second or release etch may be selected such that the protective layer 150a,b is etched at a significantly greater rate than the first etch stop layer 148. In addition, the first etch stop layer 148 (e.g., $Al_2O_3$) may be further protected if some portion of the protective layer 150a,b remains above the first etch stop layer 148, minimizing the exposure of the etch stop layer to the etchants.

Figure 9C:
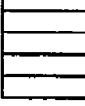
Figure 9C:
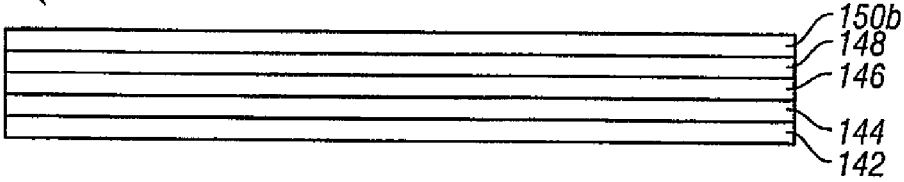

The additional layer of protection provided by the protective layer 150a,b of FIGS. 9B and 9C may advantageously minimize both exposure of the etch stop layer 148 to etchants and variations in the amount of exposure of the etch stop layer 148 to a different etch process. It will be understood that, in many manufacturing processes (such as the sacrificial material patterning process described with respect to FIGS. 10A-10H, below), the protective layer 150a,b, can shield the etch stop layer 148 from the etchants. The etch stop layer 148 can then protect the underlying dielectric layer 146 during a subsequent etch when the second etch barrier layer 150a,b is partially or completely removed, such as the release etch described below with respect to FIGS. 10E-10G.

Figure 9D:
Figure 9D:
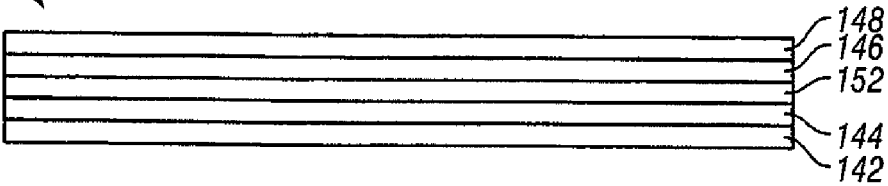

As discussed with respect to FIG. 7, an additional layer of aluminum oxide may be provided beneath the dielectric layer 146. FIG. 9D depicts such an embodiment, in which a thin film stack 140d includes a layer 152 of aluminum oxide beneath the dielectric layer 146, in addition to the etch stop layer 148 above the dielectric layer 146. Such an arrangement may modify the electromechanical characteristics of the device, namely by widening the hysteresis curve. While not illustrated, it will be understood that an additional second etch barrier layer or protective layer can also be provided over the first etch stop layer 148 in the arrangement of FIG. 9D.

Figure 10A:
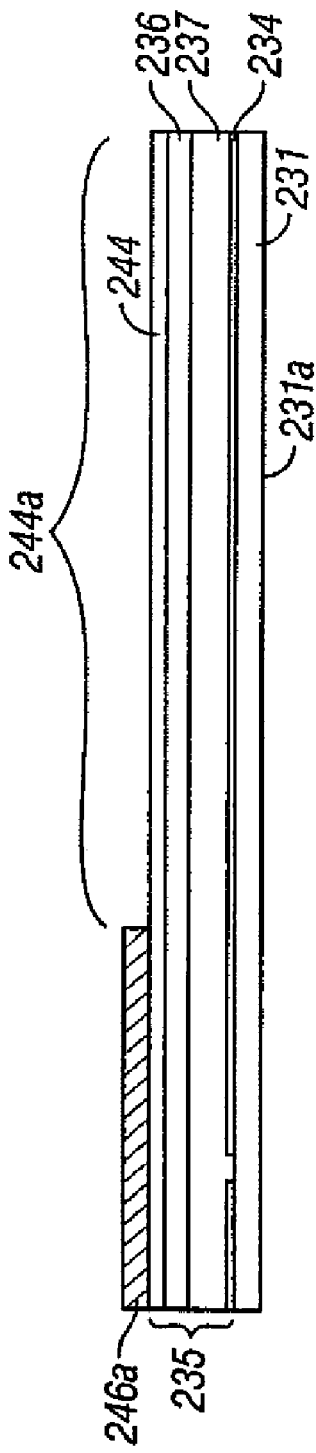
Figure 10B:
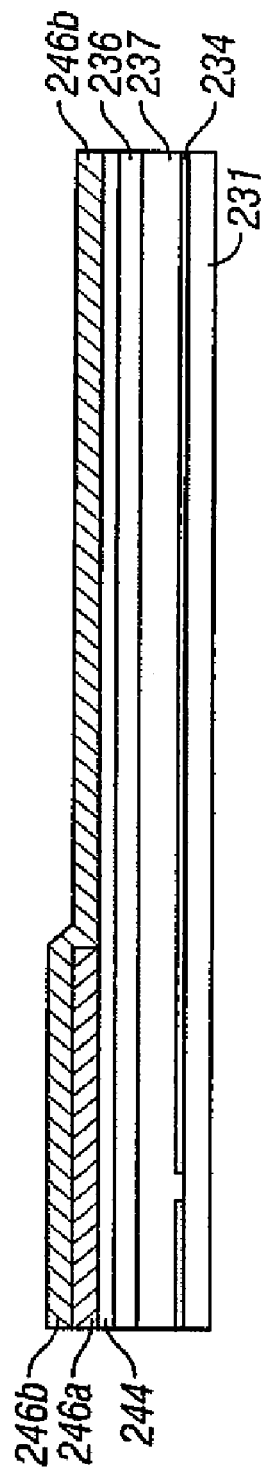

FIGS. 10A-10C are cross-sectional views illustrating the initial steps in a process for manufacturing an array of unreleased interferometric modulators (release by removal of the sacrificial material to form interferometric modulators is discussed below with reference to FIGS. 10E-10H). In FIGS. 10A-10H, the formation of an array of three interferometric modulators 200 (red subpixel), 210 (green subpixel) and 220 (blue subpixel) will be illustrated, each of the interferometric modulators 200, 210, 220 having a different distance between the lower electrode/mirror 234 and the upper metal mirror layer 238a, 238b, 238c, as indicated in FIG. 10H, which shows final configurations. Color displays may be formed by using three (or more) modulator elements to form each pixel in the resulting image. The dimensions of each interferometric modulator cavity (e.g., the cavities 275, 280, 285 in FIG. 10H) determine the nature of the interference and the resulting color. One method of forming color pixels is to construct arrays of interferometric modulators, each having cavities of differing sizes, e.g., three different sizes corresponding to red, green and blue as shown in this embodiment. The interference properties of the cavities are directly affected by their dimensions. In order to create these varying cavity dimensions, multiple sacrificial layers may be fabricated and patterned as described below so that the resulting pixels reflect light corresponding to each of the three primary colors. Other color combinations are also possible, as well as the use of black and white pixels.

FIG. 10A illustrates an optical stack 235 similar to those previously discussed (e.g. the optical stack 140b of FIG. 9B) formed by first creating an electrode/mirror layer 234 by depositing an indium tin oxide electrode layer on a transparent substrate 231, then depositing a first mirror layer on the indium tin oxide electrode layer, forming a composite layer which will be referred to as the lower electrode layer 234. In the illustrated embodiment, the first mirror layer comprises chrome. Other reflective metals such as molybdenum and titanium may also be used to form the first mirror layer. In FIG. 10, although the indium tin oxide electrode layer and the first mirror layer are indicated as a single layer 234, it will be understood that the electrode layer 234 comprises a first mirror layer which is formed on the indium tin oxide electrode layer. Such a composite structure may be used in electrode layers elsewhere in the application, as well. The viewing surface 231a of the transparent substrate 231 is on the opposite side of the substrate 231 from the lower electrode layer 234. In a process not shown here, the lower electrode layer 234 is patterned and etched to form electrode columns, rows or other useful shapes as required by the display design. As indicated in FIG. 10A, the optical stack 235 also includes a dielectric layer 237, which may comprise, for example, silicon oxide or a charge trapping layer, such as silicon nitride or other examples listed above, over the lower electrode layer 234, typically formed after the electrode layer 235 has been patterned and etched. In addition, the optical stack 235 includes a first etch barrier layer 236 over the dielectric or charge trapping layer 237. As noted above, the first etch layer 236 preferably comprises aluminum oxide. A protective or second etch stop barrier layer 244 is deposited over the first etch stop layer 236. In various embodiments, the second etch stop or barrier layer 244 comprises silicon oxide, silicon nitride, molybdenum, titanium, or amorphous silicon.

FIG. 10A further illustrates a first pixel sacrificial layer 246a formed by depositing molybdenum (in the illustrated embodiment) over the optical stack 235 (and thus over the first and second etch barriers 236, 244, the dielectric layer 237, and the lower electrode layer 234). In other arrangements, the sacrificial material can be, e.g., titanium or amorphous silicon, but in any event is selected to be different from and selectively etchable relative to the second etch barrier layer 244. The molybdenum of the illustrated embodiment is etched to form the first pixel sacrificial layer 246a, thereby exposing a portion 244a of the second etch barrier, which overlies a corresponding portion of stop layer 236 that will ultimately be included in the resulting green and blue interferometric modulators 210, 220 (FIG. 10H). The thickness of the first sacrificial layer 246a (along with the thicknesses of subsequently deposited layers as described below) influences the size of the corresponding cavity 275 (FIG. 10H) in the resulting interferometric modulator 200. The etchant used to remove a portion of first sacrificial layer 246a is preferably chosen so as to not etch the second etch barrier layer 244, or to etch it at a much lower rate than the sacrificial layer 246a. Thus, although the portion 244a of the second etch barrier is exposed, it is preferably as unaffected by these etchants as is possible. An exemplary etchant is a phosphoric/acetic/nitric acid or "PAN" etchant, which selectively removes Mo relative to the material of the second etch barrier 244 (e.g., silicon oxide, silicon nitride, titanium or amorphous silicon).

FIGS. 10B-10C illustrate forming a second pixel sacrificial layer 246b by deposition, masking and patterning over the exposed portion 244a of the second etch barrier layer 244 and the first pixel sacrificial layer 246a. The second pixel sacrificial layer 246b preferably comprises the same sacrificial material as the first pixel sacrificial layer 246a (molybdenum in this embodiment). Accordingly, the same selective etch chemistry can be employed. The second pixel sacrificial layer 246b is patterned and etched as illustrated in FIG. 10C to expose a portion 244b of the second etch barrier 244 which overlies a corresponding portion of the first etch barrier 236 that will ultimately be included in the resulting blue interferometric modulator 220 (FIG. 10H).

A third pixel sacrificial layer 246c is then deposited over the exposed portion 236b of the stop layer 236 and the second pixel sacrificial layer 246b as illustrated in FIG. 10D. The third pixel sacrificial layer 246c need not be patterned or etched in this embodiment, since its thickness will influence the sizes of all three cavities 275, 280, 285 in the resulting interferometric modulators 200, 210 220 (FIG. 10H). The three deposited pixel sacrificial layers 246a, 246b, 246c do not necessarily have the same thickness.

Figure 10E:
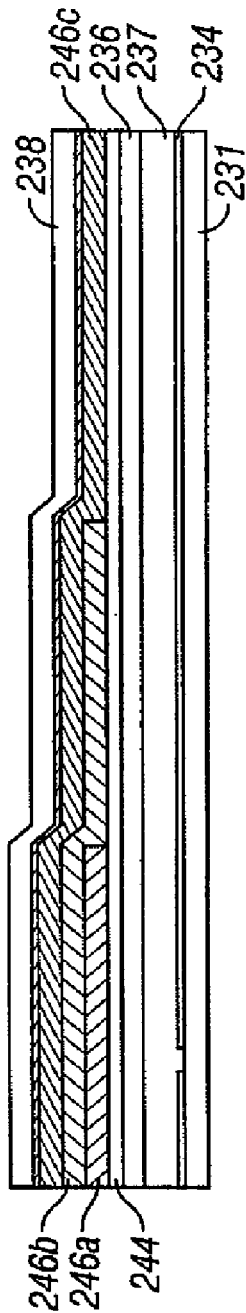

FIG. 10E illustrates forming a second mirror layer 238 by depositing a layer of aluminum-containing metal over the third pixel sacrificial layer. In the illustrated embodiment, the second mirror layer 238 also serves as an electrode. Although the foregoing description refers to certain exemplary materials for the fabrication of the various layers illustrated in FIG. 10, it will be understood that other materials may also be used, e.g., as described elsewhere in this application.

Figure 10F:
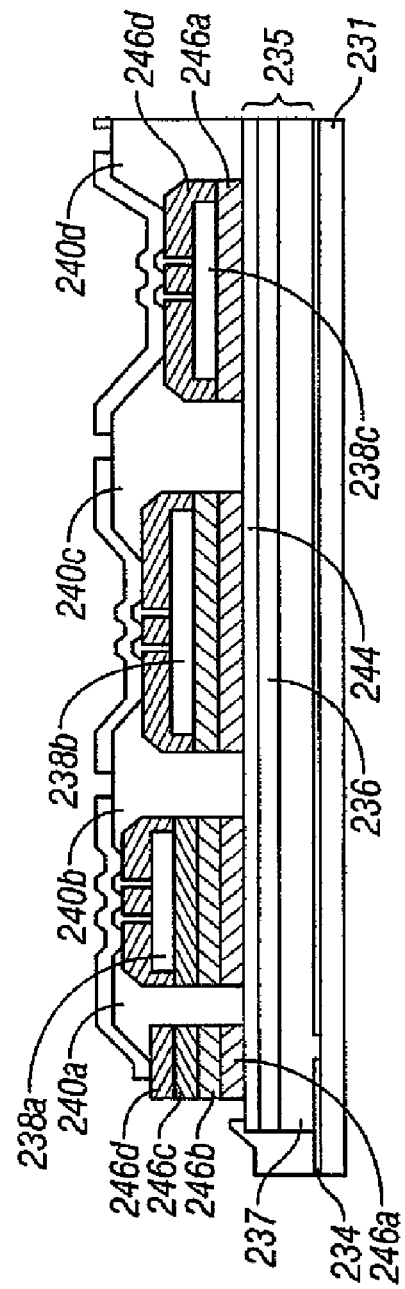

FIG. 10F illustrates an intermediate stage of the fabrication process, wherein the mirror layer 238 has been etched to form upper mirror portions 238a,b,c, and an additional layer 246d of sacrificial material has been deposited above the mirror portions 238a,b,c. Thus, pockets of sacrificial material 246a,b,c,d exist between and around the optical stack 235 and the upper mirror portions 238a, 238b, 238c. These pockets are separated by support posts 240a,b,c,d. FIG. 10G illustrates removing the sacrificial layers 246a,b,c,d to form the cavities 275, 280, 285, thereby exposing the second etch stop layer 244 underlying the portions 238a,b,c of the mirror layer. In the illustrated embodiment, gaseous or vaporous XeF$_2$ is used as an etchant to remove the molybdenum sacrificial layers 246a,b,c,d. It will be understood that XeF$_2$ may serve as a source of fluorine-containing gases such as F$_2$ and HF, and thus F$_2$ or HF may be used in place of or in addition to XeF$_2$ as an etchant for the preferred sacrificial materials.

The exposed portions 244 of the second etch stop barrier layer 244 and the sacrificial layers 246a,b,c,d will typically be at least partially removed by the release etch. For example, a very thin SiO$_2$ etch stop layer such as 244 may be removed by an XeF$_2$ etchant used to removed a molybdenum sacrificial layer. The same is true of silicon nitride, titanium, and amorphous silicon. Typically, all of the second etch barrier layer 244 is removed from over the first etch barrier layer 236 in the cavity regions 275, 280, 285, as shown in FIG. 10H. The second etch barrier layer 244 located outside of the cavities, underneath the support posts 240a,b,c,d, has not been removed by the etch, as can be seen in FIG. 10H. However, some of the second etch barrier 244 may remain even in the cavity areas after the release etching process (not shown in FIG. 10H). Any remaining second etch barrier 244 is transparent and so thin as to not affect optical properties of the device. Additionally, any remaining second etch barrier 244 will typically have a non-uniform thickness, due to differential exposure to the etchants during removal of differential thicknesses of sacrificial material. In a further embodiment, a second etchant is used to remove the second etch barrier layer 244.

A comparison of FIGS. 10H and 10E illustrates that the size of the cavity 275 (FIG. 10H) corresponds to the combined thicknesses of the three sacrificial layers 246a,b,c. Likewise, the size of the cavity 280 corresponds to the combined thickness of two sacrificial layers 246b,c, and the size of the cavity 285 corresponds to the thickness of the third sacrificial layer 246c. Thus, the dimensions of the cavities 275, 280, 285 vary according to the various combined thicknesses of the three layers 246a,b,c, resulting in an array of interferometric modulators 200, 210, 220 capable of displaying three different colors such as red, green and blue.

As discussed above, portions of the second etch barrier 244 will be exposed to a greater amount of etchant than other portions of barrier 244. This is due to the repeated deposition and etching of bulk sacrificial layer, as discussed above and depicted in FIGS. 10A-10E. While the etchant used in the pattern etching of sacrificial layers 246a and 246b is preferably selected to have as minimal an effect as possible on the second etch barrier layer 244, the etchant may have some undesirable effects on the layer 244. Thus, by the stage of the process depicted in FIG. 10G, immediately prior to removal of the bulk sacrificial material through an etching process, the second barrier layer 244 may have varying properties or height in different locations as a result of variations in etchant exposure. However, because the second barrier layer 244 is thin and transparent or completely removed from the cavities during the subsequent release etch, these variations will have a minimal effect on the optical or electromechanical behavior of the finished MEMS device. Because of the protection provided by this second barrier layer 244, the first barrier layer 236, which in certain embodiments is intended to form a part of the finished MEMS device, will be exposed to only a single etching process (the release etch), which typically is highly selective and will not attack Al$_2$O$_3$, and variations in the properties of layer 236 can be minimized.

Importantly, the first etch stop layer 236 protects the underlying dielectric (e.g., SiO$_2$) or charge trapping layer (e.g., Si$_3$N$_4$) during the release etch. The release etch is a prolonged and harmful etch, whose by-products take a long time to diffuse out of the cavities 275, 280, 285. Accordingly, underlying functional layers in the optical stack 235 are protected by the preferred Al$_2$O$_3$ etch stop layer 236.

Figure 11A:
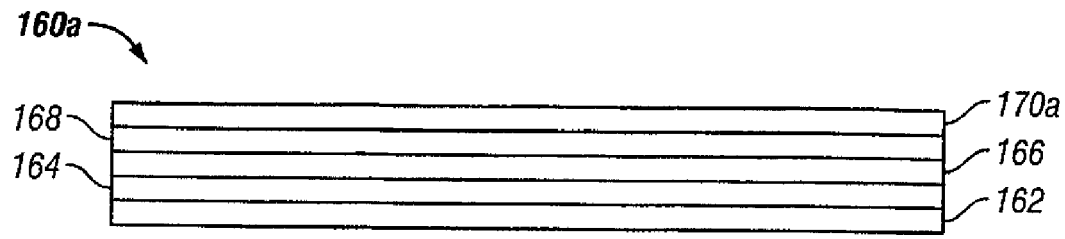
FIGS. 11A and 11B show embodiments of a thin film stack for a MEMS device.
Figure 11B:
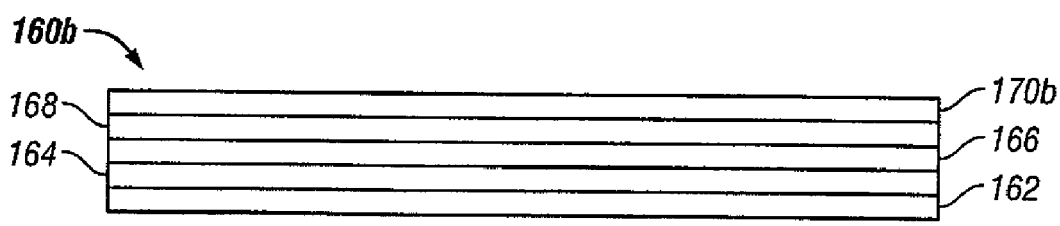

FIGS. 11A and 11B depict thin film stacks in which a silicon dioxide dielectric layer is used, and in which a protective layer is formed above the etch stop layer. With respect to FIG. 11A, a thin film stack 160a includes a dielectric layer 166 of silicon oxide located above an electrode layer 164 and a substrate 162. Above the dielectric layer 166 is located an etch stop layer 168, which preferably comprises aluminum oxide. A protective or second etch barrier layer 170a of silicon oxide is deposited above the first etch stop layer 168. In another embodiment, shown in FIG. 11B, a thin film stack 160b includes a protective or second etch barrier layer 170b, which comprises silicon nitride.

In certain embodiments, one or more portions of the thin film stack 160a,b layer may be selectively removed. In further embodiments, a protective layer may be provided above the remainder of the etch stop layer, such that a thin film structure similar to that discussed with respect to FIGS. 11A and 11B exists over at least part of the electrode. Such an embodiment is described with respect to FIG. 11C.

Figure 11C:
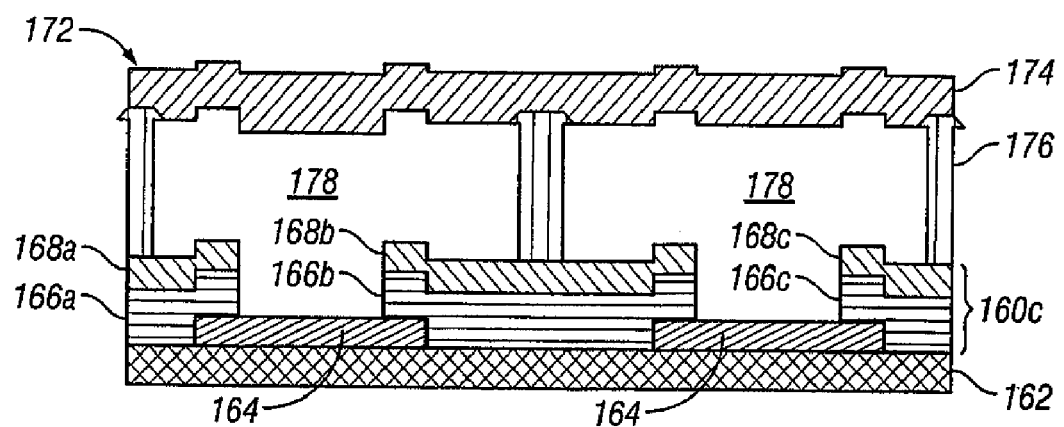
FIG. 11C is a cross section of two interferometric modulators which include a thin film stack in accordance with an embodiment of the invention.

FIG. 11C depicts a pair of interferometric modulators 172 similar to the modulators 10 of FIGS. 1 and 2, including a thin film stack 160c. The stack 160c comprises a patterned electrode layer 164, a dielectric layer which has been etched to form dielectric portions 166a, 166b, 166b, and an etch stop layer which has been etched to form etch stop portions 168a, 168b, and 168c. The formation of etch stop portions 168a,b,c may be done through the use of a photomask, a first etch to remove the selected portions of the etch stop layer 168, and a subsequent etch to remove the portions of the dielectric layer 166 uncovered by the removal of the etch stop layer 168. A displaceable reflective layer 174 is supported by posts 176, forming interferometric cavities 178.

Those skilled in the art will also appreciate that, in the illustrated embodiment, portions of the cavity may contain a dielectric constant material, e.g., some or all of the interior walls of the cavity 178 may optionally be coated or covered with a dielectric material. Preferably, this dielectric material is a low dielectric constant material. For example, after etching to form the interferometric modulator illustrated in FIG. 11C, a layer of dielectric material may be formed on the bottom electrode 164 over the exposed top surface of the bottom electrode 164. Preferably, any such layer of dielectric material is relatively thin, such that an air gap remains between the top electrode 174 and the dielectric material during both the driven and undriven states. Other interior walls of the cavity 178 that may be coated with a dielectric material include the top electrode 174 and the thin film stack 160c. If the thin film stack 160c includes a top layer of dielectric material, a thin film stack similar to stacks 160a and 160b (of FIGS. 11A and 11B, respectively) will be created. In embodiments in which a low dielectric constant material is used, preferred materials include porous dielectric materials (e.g. aerogels) and modified silicon oxides. U.S. Pat. Nos. 6,171,945 and 6,660,656 describe low dielectric constant materials and methods for making them. Preferred low dielectric constant materials have a dielectric constant of about 3.3 or less, more preferably about 3.0 or less.

Figure 11D:
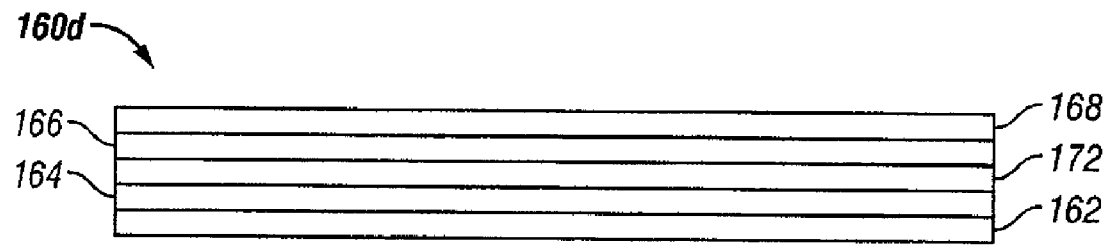
FIG. 11D shows another embodiment of a thin film stack for a MEMS device.

As discussed with respect to FIG. 9D, an additional layer of aluminum oxide may be provided beneath the dielectric layer. FIG. 11D depicts an embodiment, similar to that depicted in FIG. 9D, in which a thin film stack 160d includes a layer 172 of aluminum oxide beneath the silicon oxide dielectric layer 166, in addition to the etch stop layer 168 above the dielectric layer. As previously discussed, the inclusion of this additional layer may modify the electromechanical characteristics of the device, such as by widening the hysteresis curve.

As discussed with respect to FIG. 10, the deposition of a charge-trapping layer is preferably done after the patterning of the electrode layer. For simplicity, many of the stacks depicted and discussed in the present application depict a continuous electrode layer. However, it will be understood that these are figures are merely schematics, which are not to scale, and which represent those portions of particular thin film stacks which are located over electrodes. The formation of thin film stacks which include patterned electrodes will also result in areas of the stack in which no electrode layer exists between a portion of another layer (such as a silicon oxide layer or a charge trapping layer, e.g. silicon nitride) and the substrate.

Figure 12A:
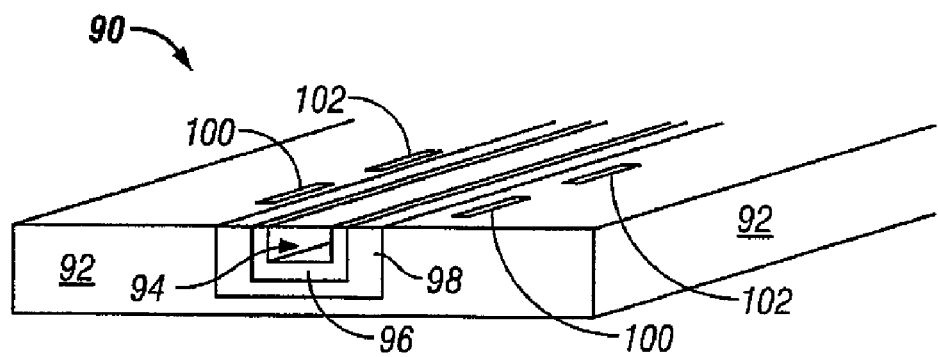
FIG. 12A shows a block diagram of an electrostatic fluid flow system within a MEMS device in accordance with one embodiment of the invention.
Figure 12B:
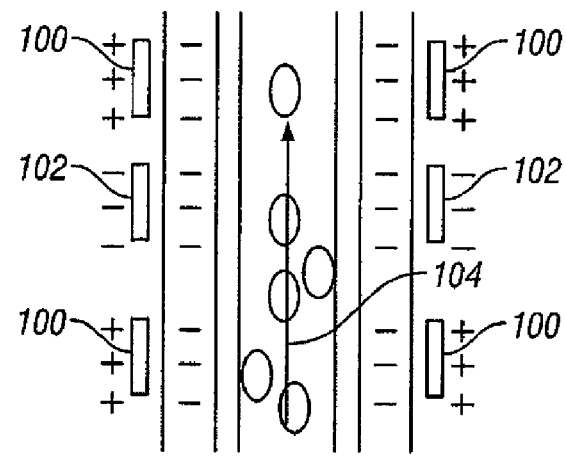
FIG. 12B is a schematic, isometric view of the fluid flow system of FIG. 8a illustrating its principle of operation.

FIGS. 12A and 12B show another application within a MEMS device wherein a charged trapping layer is used to control the electromagnetic behavior of a structure within the MEMS device.

Referring to FIG. 12A, reference numeral 90 generally indicates a portion of an electrostatic fluid flow system. The electrostatic fluid flow system includes a substrate 92 within which is formed a generally U-shaped channel 94. The channel 94 includes an inner layer 96 of a first material which is selected, for example, because of its chemical and mechanical properties, for example, the material may be particularly wear-resistant, and may demonstrate little degradation due to the flow a fluid within the channel. The channel 94 also includes an outer layer 98 which is selected for its charge-trapping properties, as will be explained in greater detail below.

The electrostatic fluid flow system 90 also includes pairs of electrodes 100 and 102 which are selectively energized to cause displacement of charge particles within a fluid in the channel 94 in the direction indicated by the arrow 104 in FIG. 8b of the drawings. In one embodiment, the outer layer 98 traps charge in the fluid thereby to provide greater control of fluid flow within the system 101. In another embodiment, the layer 98 may trap charge in order to eliminate or to reduce hysteresis effects.

Figure 13:
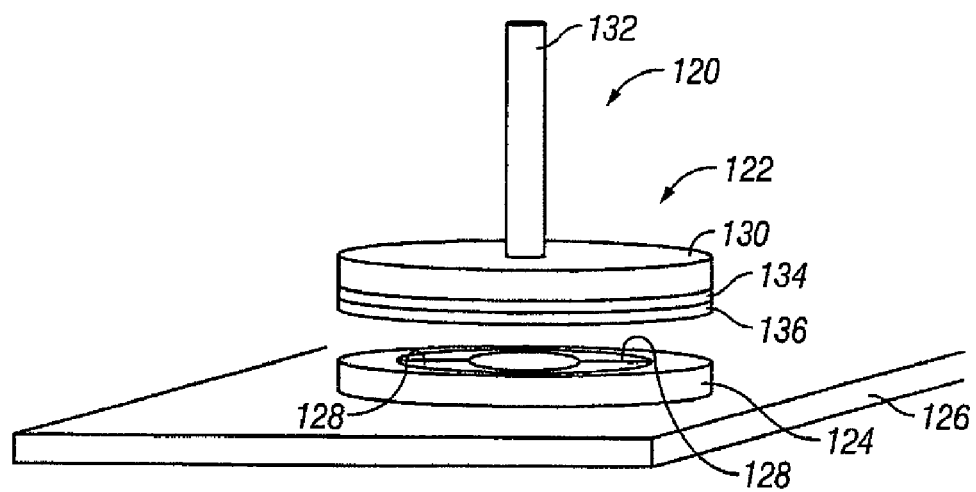
FIG. 13 schematically shows another embodiment of a MEMS device in accordance with the invention.

Referring now to FIG. 13 of the drawings, another application of using a charge-trapping layer to alter the electromechanical behavior of a structure within a MEMS device is shown. In FIG. 13, reference numeral 120 generally indicates a motor comprising a rotor 122 which is axially aligned and spaced from a stator of 124. As can be seen, the stator 124 is formed on a substrate 126 and includes electrodes 128, which, in use, are energized by a driving mechanism (not shown). The rotor 122 includes a cylindrical portion 130 which is fast with a spindle 132. The rotor 122 may be of a material that may be selected for its mechanical properties, including resistance to wear, but may have undesirable electrical properties in response to input, such as when the electrodes 128 are energized in order to cause rotation of the rotor 122. In order to compensate for these undesirable electrical properties, layers 134 and 136 are deposited on the rotor 122 in order to effectively act as a charge trapping layer to alter the electromechanical behavior of the rotor 122.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. An electromechanical device having a substrate, the device comprising:
    an electrode layer formed over the substrate;
    a dielectric layer formed over the electrode layer;
    a first etch barrier layer formed over the dielectric layer, wherein the first etch barrier layer comprises aluminum oxide;
    a second etch barrier layer formed over the first etch barrier layer, wherein the second etch barrier layer covers only a portion of the first etch barrier layer; and
    a displaceable layer located above the second etch barrier.

2. The device of claim 1, additionally comprising a cavity located between the second etch barrier layer and the displaceable layer.

3. The device of claim 1, additionally comprising a sacrificial layer located between the second etch barrier layer and the displaceable layer.

4. The device of claim 3, wherein the second etch barrier layer comprises a material resistant to an etch used to pattern the sacrificial layer.

5. The device of claim 3, wherein the first etch barrier layer comprises a material resistant to an etch used to remove the sacrificial layer.

6. The device of claim 1, wherein the second etch barrier layer comprises a material substantially resistant to a phosphoric/acetic/nitric acid etch.

7. The device of claim 1, wherein the second etch barrier layer comprises silicon oxide.

8. The device of claim 7, wherein the dielectric layer comprises silicon oxide.

9. The device of claim 7, wherein the dielectric layer comprises a charge trapping layer.

10. The device of claim 1, wherein the second etch barrier layer comprises silicon nitride.

11. The device of claim 10, wherein the dielectric layer comprises a material selected from the group of: silicon oxide and silicon nitride.

12. The device of claim 1, wherein the second etch barrier layer comprises a material selected from the group of titanium, molybdenum, and amorphous silicon.

13. The device of claim 1, wherein the second etch barrier layer has a varying thickness over the surface of the first etch barrier layer.

14. An electromechanical device, comprising:
    an electrode layer formed over a substrate;
    a dielectric layer formed over the electrode layer;
    a first etch barrier layer formed over the dielectric layer;
    a second etch barrier layer formed over the first etch barrier layer, wherein the second etch barrier layer covers only a portion of the first etch barrier layer;
    a displaceable layer located above the second etch barrier; and
    a sacrificial layer located between the second etch barrier layer and the displaceable layer.

15. The device of claim 14, wherein the second etch barrier layer comprises a material resistant to an etch used to pattern the sacrificial layer.

16. The device of claim 14, wherein the first etch barrier layer comprises a material resistant to an etch used to remove the sacrificial layer.

17. The device of claim 14, wherein the second etch barrier layer has a varying thickness over the surface of the first etch barrier layer.

18. The device of claim 14, wherein the second etch barrier covers only a portion of the first etch barrier layer.

19. The device of claim 14, wherein the second etch barrier layer comprises a material selected from the group of: silicon oxide, silicon nitride, titanium, molybdenum, and amorphous silicon.

20. An electromechanical device, comprising:
    an electrode layer formed over a substrate;
    a dielectric layer formed over the electrode layer;
    a first etch barrier layer formed over the dielectric layer;
    a second etch barrier layer formed over the first etch barrier layer, wherein the second etch barrier layer comprises silicon oxide; and
    a displaceable layer located above the second etch barrier.

21. The device of claim 20, wherein the dielectric layer comprises silicon oxide.

22. The device of claim 20, wherein the dielectric layer comprises a charge trapping layer.

23. The device of claim 20, wherein the first etch barrier layer comprises aluminum oxide.

24. The device of claim 20, wherein the second etch barrier layer has a varying thickness over the surface of the first etch barrier layer.

25. The device of claim 20, wherein the second etch barrier covers only a portion of the first etch barrier layer.

26. An electromechanical device, comprising:
    an electrode layer formed over a substrate;
    a dielectric layer formed over the electrode layer, wherein the dielectric layer comprises a material selected from the group of: silicon oxide and silicon nitride;
    a first etch barrier layer formed over the dielectric layer, wherein the first etch barrier layer comprises aluminum oxide;
    a second etch barrier layer formed over the first etch barrier layer, wherein the second etch barrier layer comprises silicon nitride; and
    a displaceable layer located above the second etch barrier.

27. The device of claim 26, wherein the second etch barrier layer has a varying thickness over the surface of the first etch barrier layer.

28. The device of claim 26, wherein the second etch barrier covers only a portion of the first etch barrier layer.

29. An electromechanical device, comprising:
    an electrode layer formed over a substrate;
    a dielectric layer formed over the electrode layer;
    a first etch barrier layer formed over the dielectric layer;
    a second etch barrier layer formed over the first etch barrier layer, wherein the second etch barrier layer comprises a material selected from the group of: titanium, molybdenum, and amorphous silicon; and
    a displaceable layer located above the second etch barrier.

30. The device of claim 29, wherein the second etch barrier layer has a varying thickness over the surface of the first etch barrier layer.

31. The device of claim 29, wherein the second etch barrier covers only a portion of the first etch barrier layer.

* * * * *